(12) United States Patent
Cosemans

(10) Patent No.: US 9,911,504 B2
(45) Date of Patent: Mar. 6, 2018

(54) NON-VOLATILE MEMORY ARRAY USING ELECTROMECHANICAL SWITCHES FOR CELL STORAGE

(71) Applicant: IMEC vzw, Leuven (BE)

(72) Inventor: Stefan Cosemans, Mol (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/558,505

(22) Filed: Dec. 2, 2014

(65) Prior Publication Data

US 2015/0179278 A1  Jun. 25, 2015

(30) Foreign Application Priority Data

Dec. 20, 2013  (EP) ..................................... 13198871

(51) Int. Cl.
*G11C 23/00* (2006.01)
*G11C 11/54* (2006.01)
*H01H 1/00* (2006.01)

(52) U.S. Cl.
CPC .............. *G11C 23/00* (2013.01); *G11C 11/54* (2013.01); *H01H 1/0094* (2013.01)

(58) Field of Classification Search
CPC ........ G11C 23/00; G11C 11/54; H01H 1/0094
See application file for complete search history.

(56) References Cited

U.S. PATENT DOCUMENTS 6,990,009 B2 *  1/2006  Bertin ..................... B82Y 10/00
                                                257/E29.174
7,719,318 B1    5/2010  Nordquist et al.
(Continued)

FOREIGN PATENT DOCUMENTS

WO   WO 2008/032069    3/2008
WO   WO 2009/101516    8/2009

OTHER PUBLICATIONS

Extended European Search Report issued in EP Application No. 13198871.9, dated Mar. 5, 2014.
(Continued)

*Primary Examiner* — Anthan Tran
*Assistant Examiner* — Mushfique Siddique
(74) *Attorney, Agent, or Firm* — Knobbe Martens Olson & Bear LLP

(57) ABSTRACT

A data storage cell for storing data is disclosed. In one aspect, the data storage cell comprises a first nano electromechanical switch comprising a first moveable beam fixed to a first anchor, a first control gate and a second control gate, a first output node against which the first moveable beam can be positioned. The data storage cell also comprises a second nano electromechanical switch comprising a second moveable beam fixed to a second anchor, a third control gate and a fourth control gate. The second moveable beam can be positioned against the first output node. Further, the first nano electromechanical switch and the second nano electromechanical switch are configured for selecting a first or a second state of the data storage cell and are configured for having their moveable beam complementary positioned to the first output node. A memory arrangement of such data storage cells is also disclosed, as well as methods for writing data to the data storage cells and for reading data from the data storage cells.

13 Claims, 12 Drawing Sheets

(56) References Cited

U.S. PATENT DOCUMENTS

| | | | |
|---|---|---|---|
| 7,911,831 B2* | 3/2011 | Rueckes | B82Y 10/00 |
| | | | 257/298 |
| 2004/0175856 A1 | 9/2004 | Jaiprakash et al. | |
| 2007/0115713 A1* | 5/2007 | Trossen | B82Y 10/00 |
| | | | 365/129 |
| 2008/0062744 A1* | 3/2008 | Bertin | B82Y 10/00 |
| | | | 365/151 |
| 2009/0268503 A1* | 10/2009 | Schepens et al. | 365/72 |
| 2009/0273971 A1* | 11/2009 | Schepens | G11C 19/00 |
| | | | 365/166 |
| 2015/0036417 A1* | 2/2015 | Jung | G06F 17/5072 |
| | | | 365/154 |

OTHER PUBLICATIONS

Guo, et al., "Resistive Computation: Avoiding the Power Wall with Low-Leakage, STT-MRAM Based Computing," ISCA, 2010, pp. 371-382.

Smullen, et al., "Relaxing Non-Volatility for Fast and Energy-Efficient STT-RAM Cache," IEEE 17th Int'l Symposium on High Performance Computer Architecture (HPCA), Feb. 2011, pp. 50-61.

Venkatesan et al., "Energy Efficient Many-core Processor for Recognition and Mining Using Spin-based Memory," IEEE/ACM Int'l Symposium on Nanoscale Architectures (NANOARCH), Jun. 2011, pp. 122-128.

* cited by examiner

NON-VOLATILE MEMORY ARRAY USING ELECTROMECHANICAL SWITCHES FOR CELL STORAGE

CROSS-REFERENCE TO RELATED APPLICATION

This application claims foreign priority to European Patent Application No. EP13198871.9, filed Dec. 20, 2013, the contents of which is incorporated by reference herein in its entirety.

BACKGROUND

Technological Field

The described technology invention relates to the field of memory cells and memory arrangements. More particularly, the disclosed technology relates to non-volatile memory cells and memory arrangements thereof based on nano electromechanical switches.

Description of the Related Technology

For data cache and other memory operations such as used in L1, L2, L3 caches, scratchpad memories, GPU memory, today's often used memory is static random access memory SRAM. They form the main memory type inside logic chips.

SRAM memory cells suffer from a number of issues: they are energy-inefficient, both from a dynamic energy consumption perspective and from a leakage energy perspective. Even if standby leakage can be mitigated by recent state-of-the-art techniques, active leakage due to SRAM remains an issue. Furthermore, for both read and write operations, data typically is to be provided at a speed depending on the location of the memory in the memory hierarchy. For example, in L3 cache, up to 10 cycles may be used. For SRAM memory cells, typically a trade-off is made between speed, area and energy consumption. SRAM memory cells also are volatile, meaning that they lose their data when in a power-off state. Furthermore, SRAM memory cells typically use up large areas of the substrate, amongst others because they require large area per bit. An area reduction would be welcome.

A number of SRAM replacement options have been explored in the last years.

One set of solutions that has been considered are solutions based on emerging non-volatile memories such as STT-MRAM and RRAM.

In "*Energy Efficient Many-core Processor for Recognition and Mining using Spin-based Memory*," IEEE Int'l Symp. on Nanoscale Architectures, June 2011, (pp. 122-128), R. Venkatesan et al. describes a specific processor having a memory based on Spin Transfer Torque Magnetic RAM (STT-MRAM). In "*Relaxing Non-Volatility for Fast and Energy-Efficient STT-RAM Cache*" (Smullen et al., IEEE Int'l Symp. on HPCA, February 2011, pp. 50-61), a design is described using only non-volatile memory (NVM) for cache memory, the non-volatile memory being STT-RAM. For optimal performance the properties of the STT-RAM are tuned, especially by relaxing the non-volatility condition. A refresh policy might be needed to hold the non-volatility. The paper "*Resistive Computation: Avoiding the Power Wall with Low-Leakage, STT-MRAM Based Computing*" (Xiaochen Guo et al., ISCA, 2010, pp. 371-382) presents a processor architecture in which most of the functionality is migrated from CMOS to STT-MRAM.

In general, compact non-volatile memory cells as now known have a read current flowing through the memory element so that no high performance read is possible. The current must be low enough to avoid cell state disturbance. Also the resistance level of the memory element must be selected in such a way that both read and write operations can be accommodated, which limit the options to improve read performance. Cells that avoid this current through the memory element typically are much less compact and often are not robust to transistor variations.

In European Patent Application No. 13198870.1, entitled "Nano-electro-mechanical based memory" and filed Dec. 20, 2013 in the name of IMEC, an SRAM replacement based on memory cells using a non-volatile NEM (nano electromechanical) switch is presented. In some implementations, the read current flows through the NEM switch may result in a slow reading step.

Consequently, there is still a need for a good SRAM replacement memory cell and corresponding memory arrangements.

SUMMARY OF CERTAIN INVENTIVE ASPECTS

It is an object of embodiments of the present invention to provide a memory element with fast read access, a memory arrangement comprising such memory cells and a bias scheme for reading and writing such memory elements.

It is an advantage of at least some embodiments of the present invention that compact memory elements are provided. It is an advantage of embodiments of the present invention that memory elements are provided having low leakage.

It is an advantage of embodiments of the present invention that memory arrangements are provided having a low active read and write energy.

It is an advantage of embodiments of the present invention that memory elements are provided having no static write current.

It is an advantage of at least some embodiments of the present invention that the energy consumption of the memory cell can be substantially lower than for SRAM memory cells.

It is an advantage of at least some embodiments according to the present invention that they can be based on horizontal beam as well as vertical beam NEM switches. The use of vertical beam NEM switches may result in a highly compact memory cell, resulting in a high density memory arrangement.

The above objective is accomplished by a method and device according to embodiments of the present invention.

The present invention relates to a data storage cell for storing data, the data storage cell comprising a first nano electromechanical switch comprising a first moveable beam fixed to a first anchor, a first control gate and a second control gate, a first output node against which the first moveable beam can be positioned, a second nano electromechanical switch comprising a second moveable beam fixed to a second anchor, a third control gate and a fourth control gate, wherein the second moveable beam also can be positioned against the first output node, the first nano electromechanical switch and the second nano electromechanical switch being configured for selecting a first or a second state of the data storage cell and being configured for having their moveable beam complementary positioned to the first output node. With complementary positioned, reference is made to the situation wherein the second moveable beam is not positioned against the first output node when the first moveable beam is positioned against the first output node. It is an advantage of embodiments of the present invention that a non-volatile and low-power memory architecture can be provided. It is an advantage of embodiments of the present invention that leakage may be advantageously low or even zero.

One or both of the nano electromechanical switches are vertical nano electromechanical switches, wherein the beam is oriented substantially vertically with respect to the average plane through both control gates of the NEM switch. It is an advantage of embodiments of the present invention that a data storage cell with a small memory footprint can be obtained.

The data storage cell furthermore may comprise at least a first read selector, comprising a first, second and third selector terminal, the first selector terminal being connected to the first output node (Q), the second selector terminal being connected to a read bit line (RBL) and the third selector terminal being connected to a DC bias or a second data line (RVSS). It is an advantage of embodiments according to the present invention that a data storage cell with fast read-out capabilities can be obtained.

The first read selector may be a field-effect transistor element. It may be an NMOS element. It is an advantage of embodiments of the present invention that read current can be routed through a single FET.

The first and/or the second read selector may be a MOSFET.

The first and second nano electromechanical switch may comprise a common second node or each may comprise a separate second node against which their moveable beam can be positioned.

The second node may be a floating node or may be a second output node.

The data storage cell may comprise two read selectors, the first read selector being connected to the first output node and the second read selector being connected to the second output node, the second read selector thus providing the complementary read from the first read selector. It is an advantage of embodiments according to the present invention that it is easy to enhance read performance by providing a complementary read selector and read bit line.

The second read selector also may be a field-effect transistor element. It may be an NMOS element. It is an advantage of embodiments of the present invention that read current can be routed through a single FET. The second read selector may be a MOSFET.

The first and the second anchor may be connected to data lines for providing data to be stored to the data storage cell and wherein the first and second control gate, respectively the third and the fourth control gate are connected with write word lines and configured for enabling the movement of the first moveable beam respectively the second moveable beam according to the data provided to the anchors.

The first respectively the second anchor may be connected with word lines (WL, WLG) for enabling the movement of the first moveable beam respectively the second moveable beam and the first and second control gate, respectively the third and the fourth control gate may be connected with data lines for providing data to be stored to the data storage cell.

The present invention also relates to a memory arrangement that may comprise a plurality of data storage cells, one or more of the data storage cells being a data storage cell as described above.

The present invention also relates to a method for writing data to a data storage cell comprising two nano electromechanical (NEM) switches, the two nano electromechanical (NEM) switches comprising respectively a first anchor, first control gate, second control gate and a second anchor, third control gate and fourth control gate, the method comprising controlling moveable beams of the first, respectively the second NEM switch so that one of the moveable beams contacts a first output node of the data storage cell, whereas the other moveable beam contacts another node of the data storage cell, and writing data to the data storage cell by providing an electrical signal to the first and second anchors and to the first, second, third and fourth control gates.

Said controlling and writing may comprise providing a first digital state at a write control gate of the first NEM switch and a complementary/write control gate of the second NEM switch and providing a second digital state, complementary to the first digital state, at a write control gate of the second NEM switch and a complementary/write control gate of the first NEM switch, thus controlling positioning of the moveable beams and providing data to be stored.

The electrical signals applied to the control gates may enable the movement of the beams, and the electrical signals applied to the anchors may determine the data that is to be written.

Alternatively, the electrical signals applied to the anchors may enable the movement of the beams, and the electrical signals applied to the control gates may determine the data that is written.

Particular aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiments described hereinafter.

Figure 1:
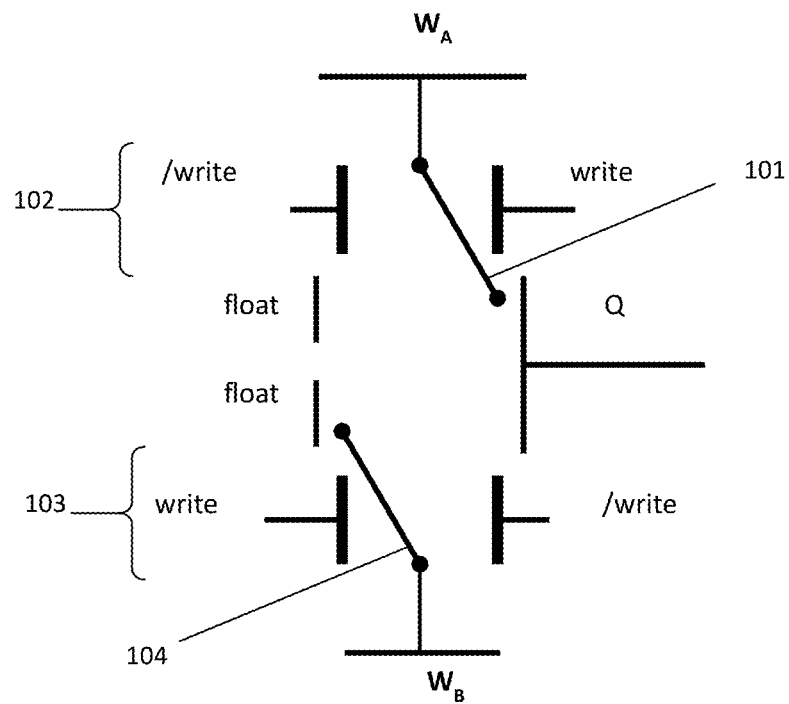
FIG. 1 and FIG. 2 illustrate a schematic representation of a data storage cell with two complementary NEM switches for a cell state value 0 respectively a cell state value 1, according to an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, embodiments of the present invention relate to a data storage cell for storing data. The data storage cell can advantageously be used as an SRAM replacement circuit component for use in embodiments of the present invention, e.g. a basic element in an embedded memory system, such as a cache memory, a GPU memory or scratchpad memory. These data storage cells based on NEM switches advantageously enable a non-volatile and low-power memory architecture. The NEM switches can for example be implemented as a vertical switch, furthermore resulting in data storage cells with low footprint, which can result in dense memory arrangements.

According to embodiments of the present invention, the data storage cell comprises a first and a second nano electromechanical switch. The first nano electromechanical switch comprises a first moveable beam fixed to a first anchor, a first control gate and a second control gate, a first output node against which the first moveable beam can be positioned. The second nano electromechanical switch comprises a second moveable beam fixed to a second anchor, a third control gate and a fourth control gate, the second moveable beam also can be positioned against the first output node. According to embodiments of the present invention, the first nano electromechanical switch and the second nano electromechanical switch are configured for actuating a first or a second state of the data storage cell. Furthermore they are configured for having their moveable beam complementary positioned to the first output node. With complementary positioned, reference is made to the situation wherein the second moveable beam is not positioned against the first output node when the first moveable beam is positioned against the first output node. It is an advantage of embodiments of the present invention that a non-volatile and low-power memory architecture can be provided.

In advantageous embodiments, the data storage cell furthermore comprises at least a first read selector comprising a first, second and third terminal. The first selector terminal thereby is connected to the first output node (Q). The output node thereby is an inner of the NEM switches part. The second selector terminal typically is connected to a read bit line (RBL). The third selector terminal typically is being connected to a DC bias or a second data line (RVSS). The read selector may in some examples be a field-effect transistor element, for example be a MOSFET, although embodiments are not limited thereto. In other embodiments, the NEM switches also comprise a second node configured as second output node for outputting the complementary read out and the cell comprises a second read selector connected with the second output node. As will be discussed in more detail below, the data storage cell may be adapted for different read out or write schemes. In one embodiment, the first and the second anchor are connected to data lines for providing data to be stored to the data storage cell and the control gates are connected with write word lines and configured for controlling the movement of the moveable beams. In another embodiment, the first and second anchor are connected to write word lines for controlling the movement of the moveable beams and the control gates are connected to data lines for providing data to be stored to the data storage cell.

By way of illustration, embodiments of the present invention not being limited thereto, further standard and optional features of at least some embodiments of the present invention will be discussed further below by means of a number of examples.

In one aspect, the present invention also relates to a non-volatile memory arrangement. Such a memory arrangement comprises a plurality of data storage cells where advantageously all, but at least one or more of the data storage cells are data storage cells according to an embodiment as described in the first aspect. Features and advantages as described in the first aspect can thereby be exploited at the level of the memory arrangement. In one embodiment, the memory arrangement comprises a plurality of data storage cells arranged in an array, whereby the data storage cells are provided as translated identical copies, advantageously reducing cross-talk between read bit lines of adjacent cells, as will be further illustrates in the examples. In another particular example, the read bit line and the supply line may be twisted to cancel disturbance on neighboring lines. Other particular arrangements may be provided, taking into arrangement rules as known by the person skilled in the art.

In still another aspect, embodiments of the current invention relate to the use of the data storage cells in a memory arrangement for storing data or for controlling the operation of circuits. Such a memory arrangement may be used in a variety of applications, such as for example applications making use of configurable routing or configurable logic, or as content-addressable memory.

In yet another aspect, embodiments of the present invention relate to methods for writing and reading data storage cells. According to embodiments of the present invention, for example a method for writing data to a data storage cell comprising two nano electromechanical (NEM) switches is described. Such a method comprises controlling moveable beams of the first, respectively the second NEM switch so that one of the moveable beams contacts a first output node of the data storage cell, whereas the other moveable beam contacts another node of the data storage cell. The method also comprises writing data to the data storage cell by providing an electrical signal to the first and second anchors and to the first, second, third and fourth control gates. Particular writing schemes will be discussed in more detail in the examples discussed below. For example in one embodiment, the electrical signals applied to the control gates enable the movement of the beams and the electrical signals applied to the anchors determines the data that is written. The data to be written thus is provided via two data lines that contact the anchor of the first respectively the second NEM switch of the cell. The beams are hence sensitized for writing by the write and /write control lines, and the state to be written is controlled by the data lines. In another example, the electrical signals applied to the anchors enable the movement of the beams, and the electrical signals applied to the control gates determine the data that is written. In other words, in this case, the writing process comprises providing control data for controlling the movement of the moveable beams via an anchor of the moveable beams and providing data-dependent control signals via control gates of the EM switches for providing data to be stored to the data storage cell. In other embodiments, the method comprises reading of data storage cells. The method may typically comprise controlling moveable beams of the first, respectively the second NEM switch so that one of the moveable beams contacts a first output node of the data storage cell, whereas the other moveable beam contacts another node of the data storage cell, and providing electrical control signals for controlling at least one read selector so as to read out a signal from the first output node of the data storage cell. The read selector may be a FET, e.g. a MOSFET.

In the following, a number of particular examples of data storage cells and write and read schemes for such cells are discussed, the examples illustrating standard and optional features of embodiments according to the present invention.

Figure 2:
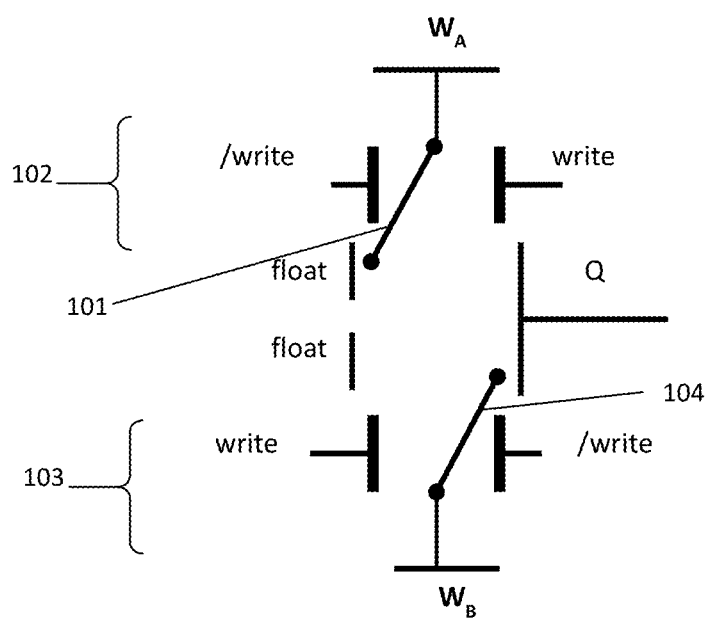

FIG. 1 and FIG. 2 schematically show a first exemplary data storage cell. This circuit comprises a pair of nano electromechanical (NEM) switches. The pair of NEM switches can be actuated to switch the circuit in either one of two states, cell state 0 and cell state 1, respectively illustrated in FIG. 1 and FIG. 2.

Rather than storing a data bit in the state of one NEM switch, e.g. the first NEM switch 102, the data bit state is stored in two complementary NEM switches, e.g. the first NEM switch 102 and the second NEM switch 103. The first NEM switch 102 comprises a movable beam 101 which can be actuated by applying a write signal write and its complement /write to respectively a first and second control gate. Thus, depending on the state in which the moveable beam 101 is switched, an electrical signal $w_A$ which is provided via a first anchor/source terminal can be electrically connected to or disconnected from the first output node Q. The second NEM switch 103 also comprises a movable beam 104 which can be actuated by applying a write signal /write and its complement write to respectively a first and a second control gate. Thus, depending on the state in which the movable beam 104 is switched, an electrical signal $w_B$ which is provided via a second anchor/source terminal can be electrically connected to or disconnected from the first output node Q. The two NEM switches 102,103 are complementary in the sense that when the movable beam 101 enables the electrical signal wA to flow to the first output node Q, the second movable beam 104 disables conduction of the electrical signal wB to the first output node Q, and vice versa. Thus, the output node Q is either connected to $W_A$ or to $W_B$. When the movable beam 101,104 is not connected to the output node Q, the beam 101,104 may be connected to an electrically floating node. This floating node may be a separate node for movable beam 101 and movable beam 104, e.g. electrically isolated from each other, as shown in FIG. 1 and FIG. 2, or may be a merged node for movable beam 101 and movable beam 104. However, in other embodiments of the present invention, when not connected to the output node Q, the movable beam 101,104 may also be connected to a second output node $Q_{bar}$, which thus provides a complementary output.

Figure 3:
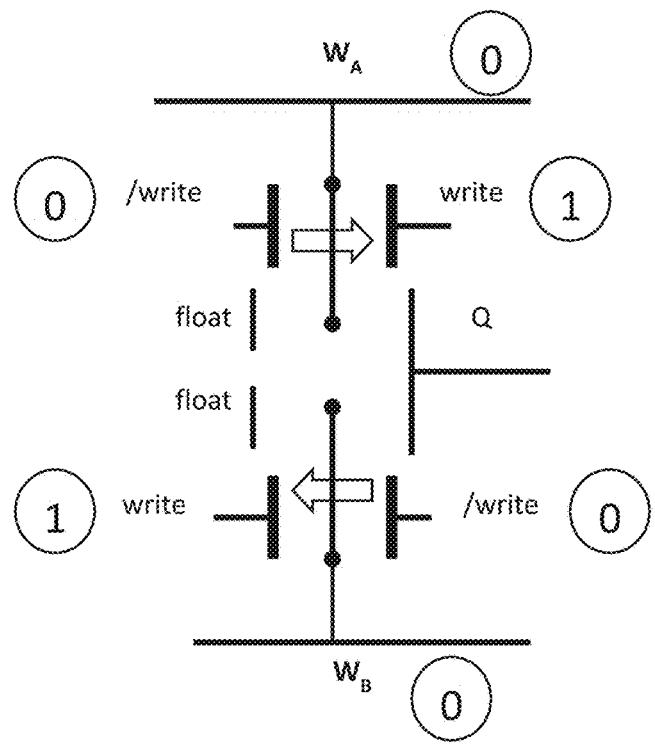
FIG. 3, FIG. 4 and FIG. 5 illustrate an exemplary method of writing a value 0 (FIG. 3), a value 1 (FIG. 4) and for not disturbing data-line half-selected elements during writing (FIG. 5), according to an embodiment of the present invention.
Figure 4:
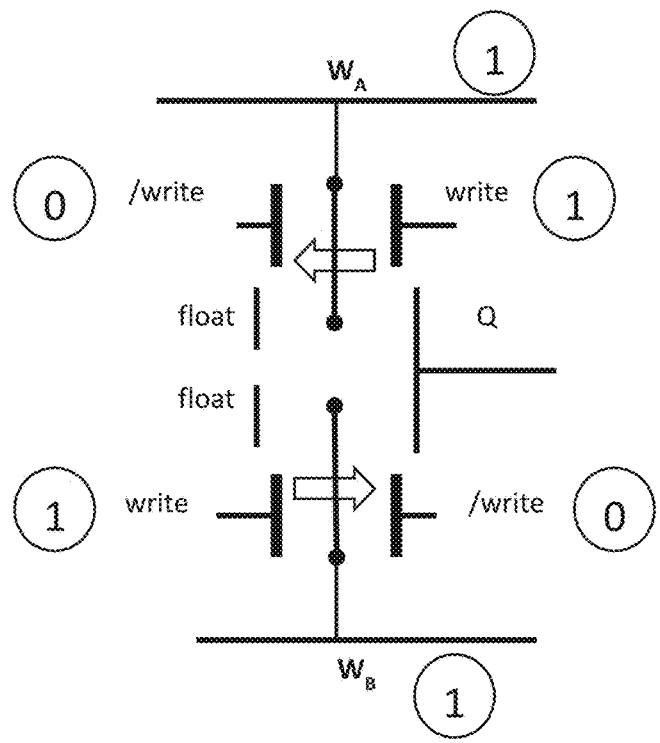
Figure 5:
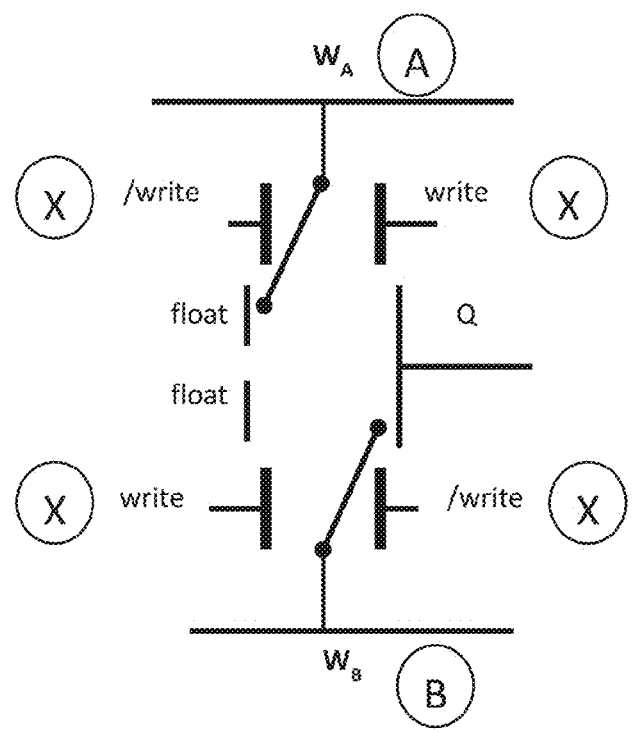

A first method for writing data to the storage cell with two complementary NEM switches illustrated in FIG. 1 and FIG. 2 is illustrated in FIG. 3 to FIG. 5. This first method corresponds to a straightforward biasing scheme, in which the data to be stored is provided via the electrical signals $W_A$ and $W_B$, while the write signal write and its complement /write are used to sensitize the beams, e.g. to impose a write event of the supplied data.

FIG. 3 illustrates operation of the circuit in accordance with this first method for a write event of a digital 0 state. A signal representing the digital 0 state, e.g. a low or zero voltage state, is supplied as the electrical signals $w_A$ and $w_B$. A digital 1 state, e.g. a high voltage state, is provided at the write control gates, while a complementary digital 0 state is provided at the /write control gates. Thus the cell switches to the 0 state in which the $w_A$ line connects to the first output node Q. FIG. 4 illustrates operation for a write event of a digital 1 state. The electrical signals $w_A$ and $w_B$ are supplied such as to correspond to a digital 0 state. A digital 1 state is provided at the write control gates, while a complementary digital 0 state is provided at the /write control gates. Thus the cell switches to the 1 state in which the $w_B$ line connects to the first output node Q. FIG. 5 illustrates that cells that are connected to actuated $w_A$ and $w_B$ lines, but not to activated write lines (half-selected cells) do not suffer state loss. For non-activate write lines, write and /write are put at the same potential, e.g. 0. Half-selected cells do not suffer state loss, as for each beam, the electrostatic actuation force of the two control gates substantially cancel one another.

Figure 6:
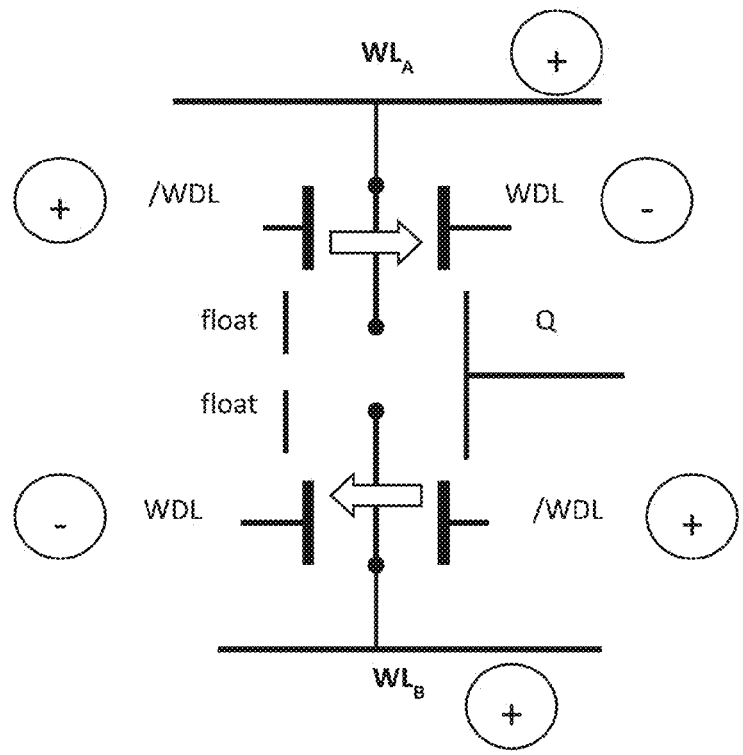
FIG. 6, FIG. 7, FIG. 8 and FIG. 9 illustrate an exemplary alternative method of writing a value 0 (FIG. 6), a value 1 (FIG. 7), for not disturbing WDL half selected elements (FIG. 8) and for not disturbing WL half selected cells (FIG. 9), according to an embodiment of the present invention.
Figure 7:
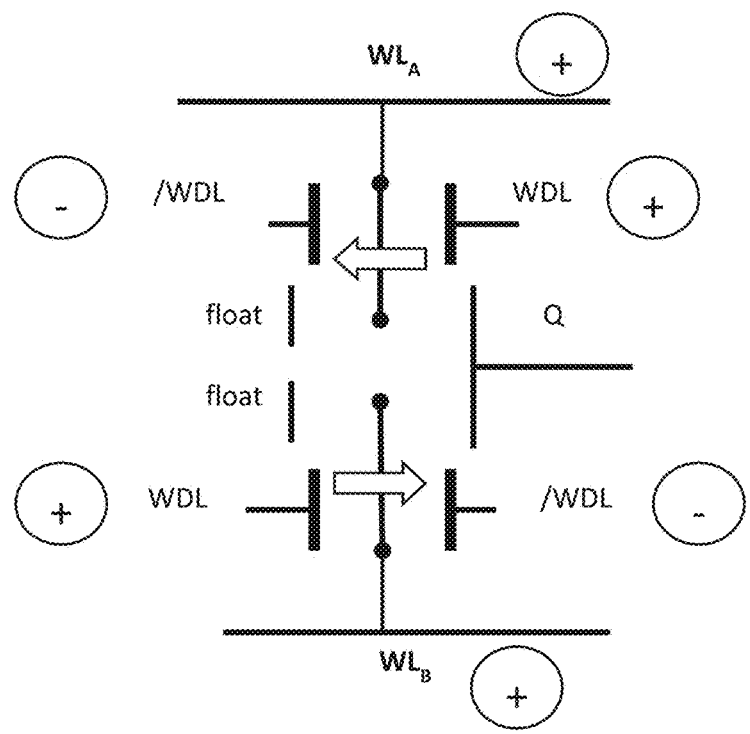
Figure 8:
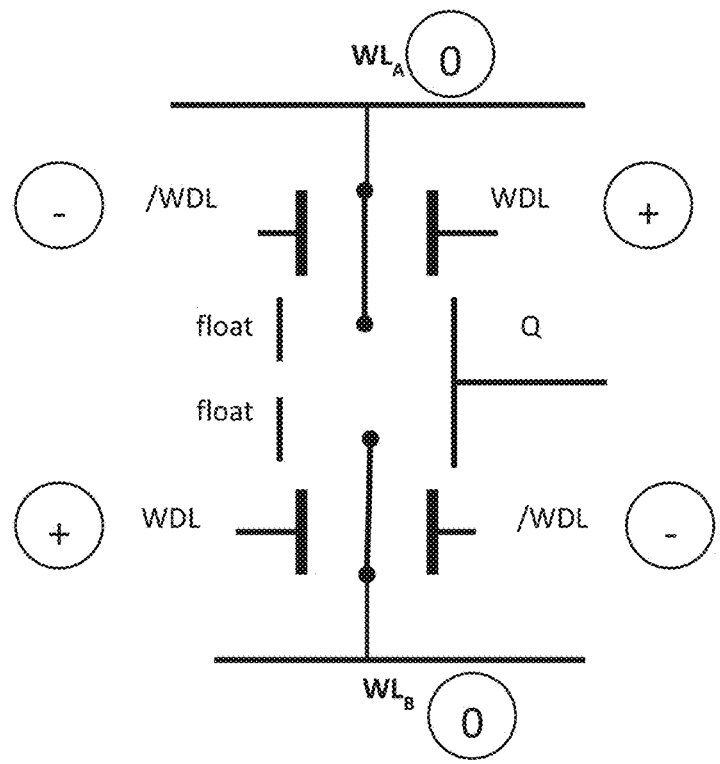

A second method for writing data to the storage cell with two complementary NEM switches illustrated in FIG. 1 and FIG. 2 is illustrated in FIG. 6 to FIG. 8. In this second method, the data to be stored and its complement are respectively provided via the write signals write and /write, and the electrical signals $W_A$ and $W_B$ are used to sensitize the beams for a write event. Although this method might be more complex than the first method, it may advantageously integrate well into a memory array architecture, e.g. can handle bit line and word line addressing efficiently.

FIG. 6 illustrates operation of the circuit in accordance with this second method for a write event of a digital 0 state. A signal representing a positive state +, e.g. a positive voltage state, is supplied via the WDL control gates. The complementary negative state −, e.g. a negative voltage state, is supplied via the /WDL control gates. Furthermore, the electrical signals $WL_A$ and $WL_B$ are also supplied as a positive + state to sensitize the beams for writing. Thus the cell switches to the 0 state in which the $WL_A$ line connects to the first output node Q. Following this scheme, there will be cells in the array that are half-selected: their control gates are connected to WDL and /WDL which are either at +1/−1 or −1/+1. These half-selected cells must maintain their state. This is achieved by keeping their anchor/beam at 0, whereby the electrostatic forces to both sides cancel one another. In the word that is to be written, the cells are sensitized for writing by putting the anchor beam at +1, thus making the electrostatic force to the −1 control gate side large and the force towards the other control gate small or even 0.

FIG. 7 illustrates a write event of a digital 1 state. A signal corresponding to a negative state − is supplied via the write control gates, and the complementary positive state + is supplied via the /write gates. Here also, the electrical signals $WL_A$ and $WL_B$ correspond to a positive + state to initiate a write event. Thus the cell switches to the 1 state in which the $WL_B$ line connects to the first output node Q.

FIG. 8 illustrates the situation whereby disturbance of write data line half-selected cells is avoided. Cells in non-selected words are exposed to the same WDL and /WDL as the cells in the word that is to be written. By putting $WL_A$ and $WL_B$ equal to 0, no net electrostatic force is felt by the beams.

Figure 9:
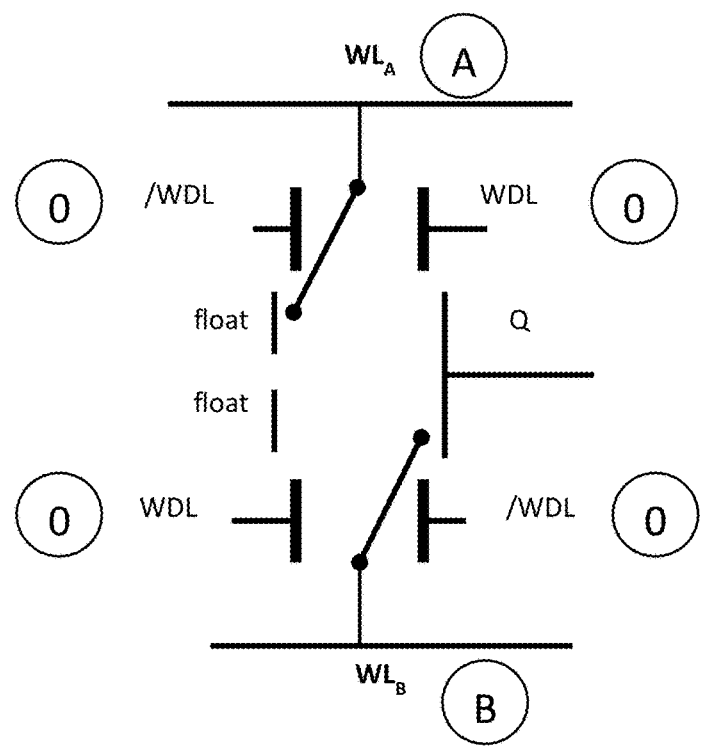

FIG. 9 illustrates the situation whereby disturbance of word line half selected cells is avoided. The electrical signal $WL_A$ may correspond to a state A, e.g. either − or +, while the electrical signal $WL_B$ corresponds to a state B, e.g. either − or +, e.g. equal or complementary to A. A neutral signal is provided to both the write and the /write control gates, e.g. a ground voltage state, such as the mean of the positive state + and negative state − potentials. Thus the cell maintains its current state, and depending on this current state, the signal $WL_A$ or $WL_B$ is supplied to the first output node Q.

Figure 10:
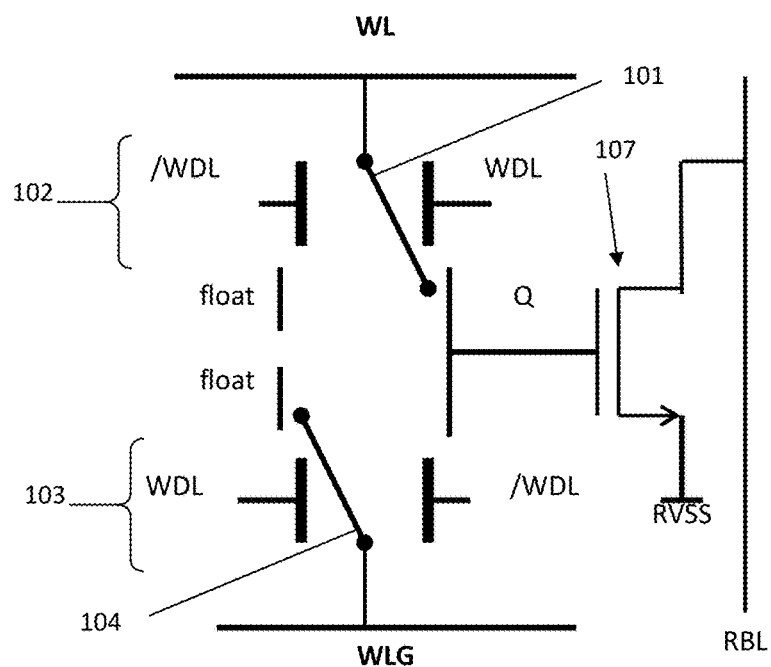
FIG. 10 and FIG. 11 illustrate a memory cell schematic for a cell with two complementary NEM switches with a single NMOS transistor for a cell state value 0 respectively a cell state value 1, according to an embodiment of the present invention.
Figure 11:
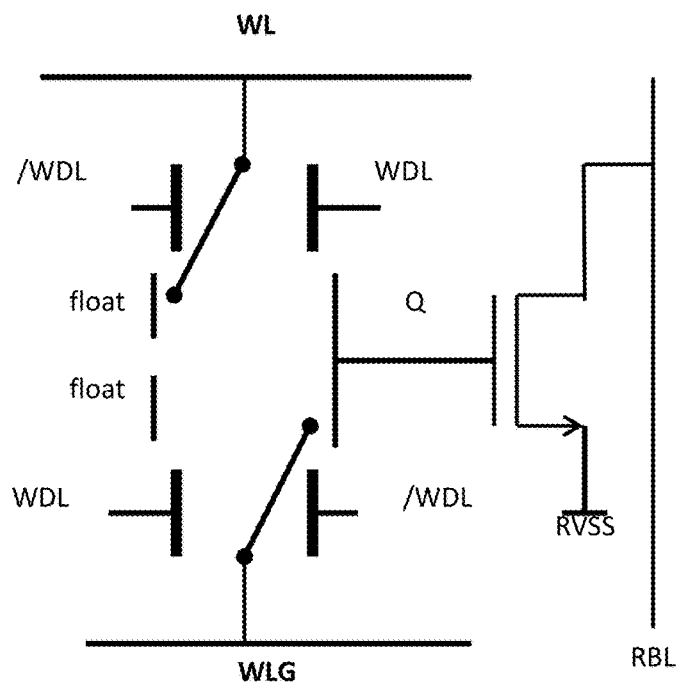
Figure 12:
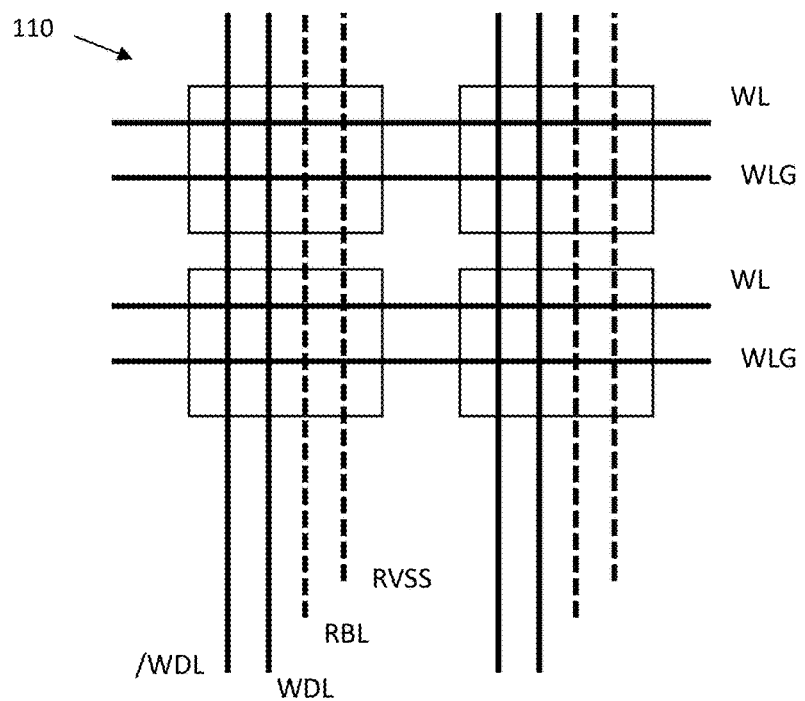
FIG. 12 illustrates a memory array organization according to an embodiment of the present invention.

FIG. 10 and FIG. 11 schematically show a device comprising such a data storage cell, e.g. an SRAM replacement circuit component, for use in embodiments of the present invention. This circuit comprises a pair of nano electromechanical (NEM) switches and a field-effect transistor element, e.g. a metal-oxide semiconductor field-effect transistor (MOSFET). As described above, the data storage cell comprises a pair of NEM switches which can be actuated to switch the circuit in either one of two states, cell state 0 and cell state 1, respectively illustrated in FIG. 10 and FIG. 11. However, in this cell adapted for single-ended read, the first output node Q is connected to a gate terminal of the field-effect transistor element 107, e.g. a NMOS element. This transistor 107 connects a read-bitline RBL to a voltage supply line RVSS, e.g. whereby in one example RVSS may be 0V, but other voltages also can be selected. Thus, the read current may pass through a single transistor element, which may provide an advantageously fast bitline discharge compared to other single-ended cells. The bit line precharge level may be freely selected, unlike in the case of traditional 6T SRAM cells, where a low BL precharge voltage (<Vdd−$V_{threshold, NMOS}$) results in read disturbs. Furthermore, a low energy consumption compared to SRAM may be achieved. The first anchor terminal and the second anchor terminal may be respectively connected to a first word line WL and a second word line WLG, while a write data line WDL is connected to respectively the first control gate of the first NEM switch 102 and the second control gate of the second NEM switch 103, and a complementary write digit line /WDL to respectively the second control gate of the first NEM switch 102 and the first control gate of the second NEM switch 103. A corresponding array organization scheme for this second data storage cell is schematically shown in FIG. 12.

Figure 13:
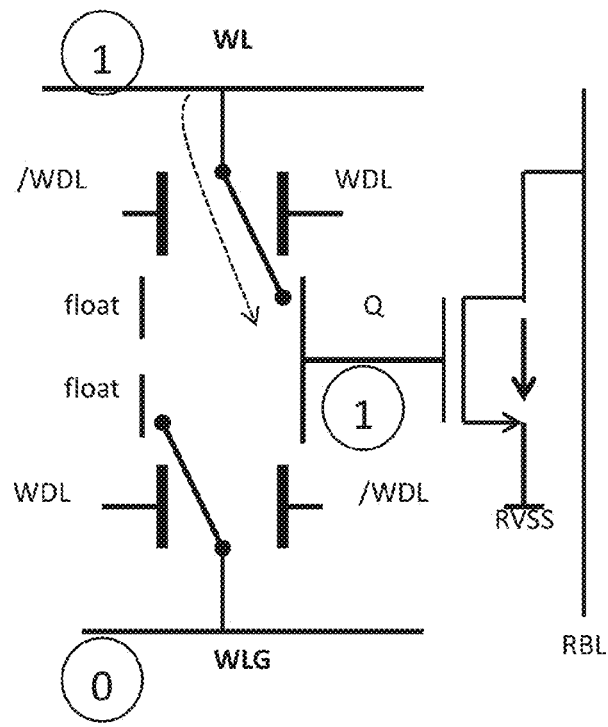
FIG. 13 and FIG. 14 illustrate data storage cells of a high-performance read SRAM for a cell state value 0 respectively a cell state value 1, according to an embodiment of the present invention.
Figure 14:
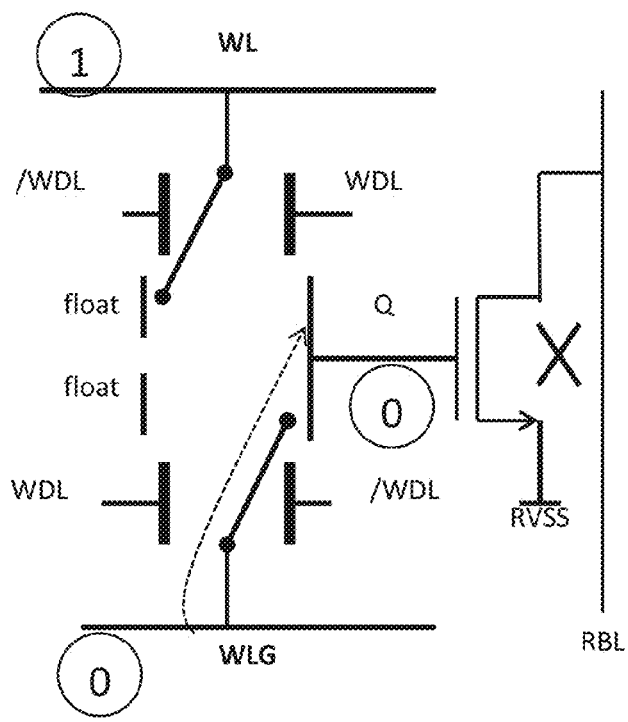

An exemplary readout of the device is illustrated in FIG. 13 and FIG. 14, for respectively a cell in state 0 and a cell in state 1. As described hereinabove, the cell data content is stored in the complementary NEM switches 102 and 103. Before readout, all non-active word lines WL and WLG may set to the digital 0 level. Then, the read bit line RBL may be precharged to a certain voltage $V_{prech}$, e.g. a positive supply voltage Vdd or 0.2V, and the selected word line WL, e.g. the active word line, is set to the digital 1 level. Then, depending on cell state, the read bit line RBL is discharged or not, e.g.

to provide a digital 0 signal for a cell in state 0 such as depicted in FIG. 13, or to provide a digital 1 signal for a cell in state 1 such as depicted in FIG. 14. Thus the stored value supplied over the read bit line RBL may be read as in a conventional SRAM, e.g. with a sense amplifier.

This arrangement according to embodiments may have several advantages. For example, a memory chip may be manufactured which is smaller than 6T SRAM, for example comparable to RRAM/STT-MRAM. Furthermore, leakage may be advantageously low or even substantially zero. The read current can be routed through a single field-effect transistor instead of two FETs in series. Thus, a fast bit line discharge can be achieved, e.g. twice as fast as in conventional SRAM technology. The disclosed memory cell according to embodiments furthermore may not require a static write current. The memory cell is furthermore adaptable in terms of a freely selectable bit line precharge voltage, e.g. a low $V_{prech}$ can be selected to achieve a low energy consumption.

Figure 15:
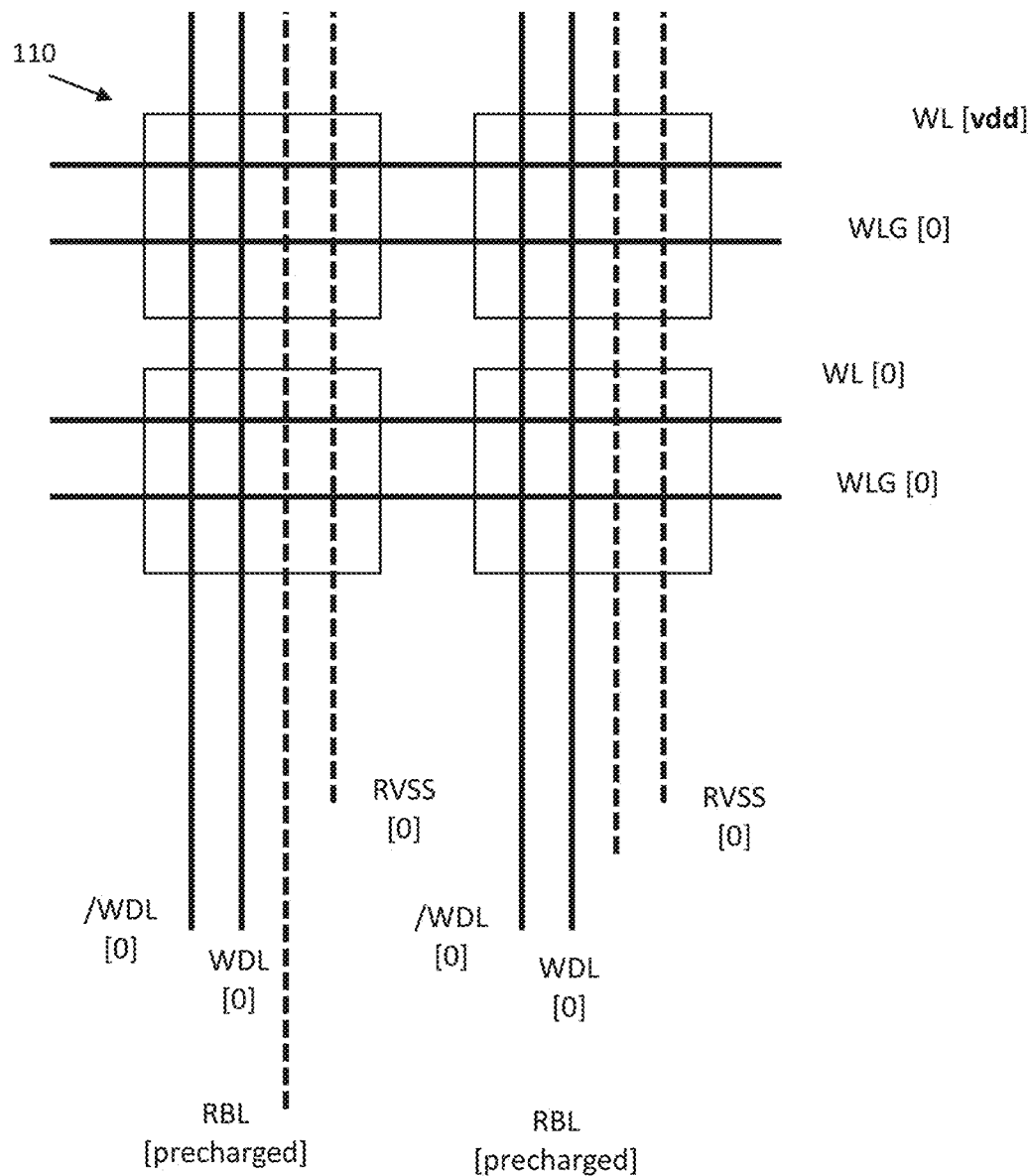
FIG. 15 illustrates a memory array organization for react biasing, according to an embodiment of the present invention.

FIG. 15 shows a read biasing scheme in accordance with embodiments of the present invention. During read-out, the write digital lines WDL and /WDL are set to digital 0 for all cells in the array. For the selected data storage cell 110, the first word line WL is set to digital 1, while the second word line WLG is set to digital 0. If the cell is in state 0, the first output node Q is connected to the first word line WL, and thus also set to the digital 1 state. Therefore, the precharged bit line BL is discharged by a bit line current $I_{BL}$. On the other hand, if the cell is in state 1, the first output node Q of the active cell is connected to the second word line WLG, and thus set to digital 0. Therefore, the precharged bit line BL is not discharged, e.g. the bit line current $I_{BL}=0$.

For the bit line half selected (BLHS) cells, the first word line WL and the second word line WLG are both set to digital 0. If the cell is in state 0, the first output node Q is connected to the first word line WL, and if the cell is in state 1, the first output node Q is connected to the second word line WLG. In either case, the first output node Q is set to digital 0. Therefore, no discharge current $I_{BL}$ flows through the FET element, e.g. the bit line BL is in the bit line half selected cells isolated via a high impedance path through the FET.

In case one word line WL connects the cells of more than one word, there are also word line half selected (WLHS) cells. For these cells, the first word line WL is set to digital 1, while the second word line WLG is set to digital 0, as for the selected cell. If the cell is in state 0, the first output node Q is connected to the first word line WL, and thus also set to the digital 1 state. Therefore, the bit line BL would be discharged if it were precharged, which consumes energy. An advantage compared to conventional 6T SRAM is that it is possible to not precharge BLs that do not contain selected cells without risking cell state disturbance.

Note that due to the symmetric electrostatic actuation, there is no read disturb problem as may be encountered in conventional memory technology. Also, in normal operation, all cells have been correctly written and hence their beams are in the complementary state, such that under normal circumstances no static current between the word lines WL and WLG can flow.

Figure 16:
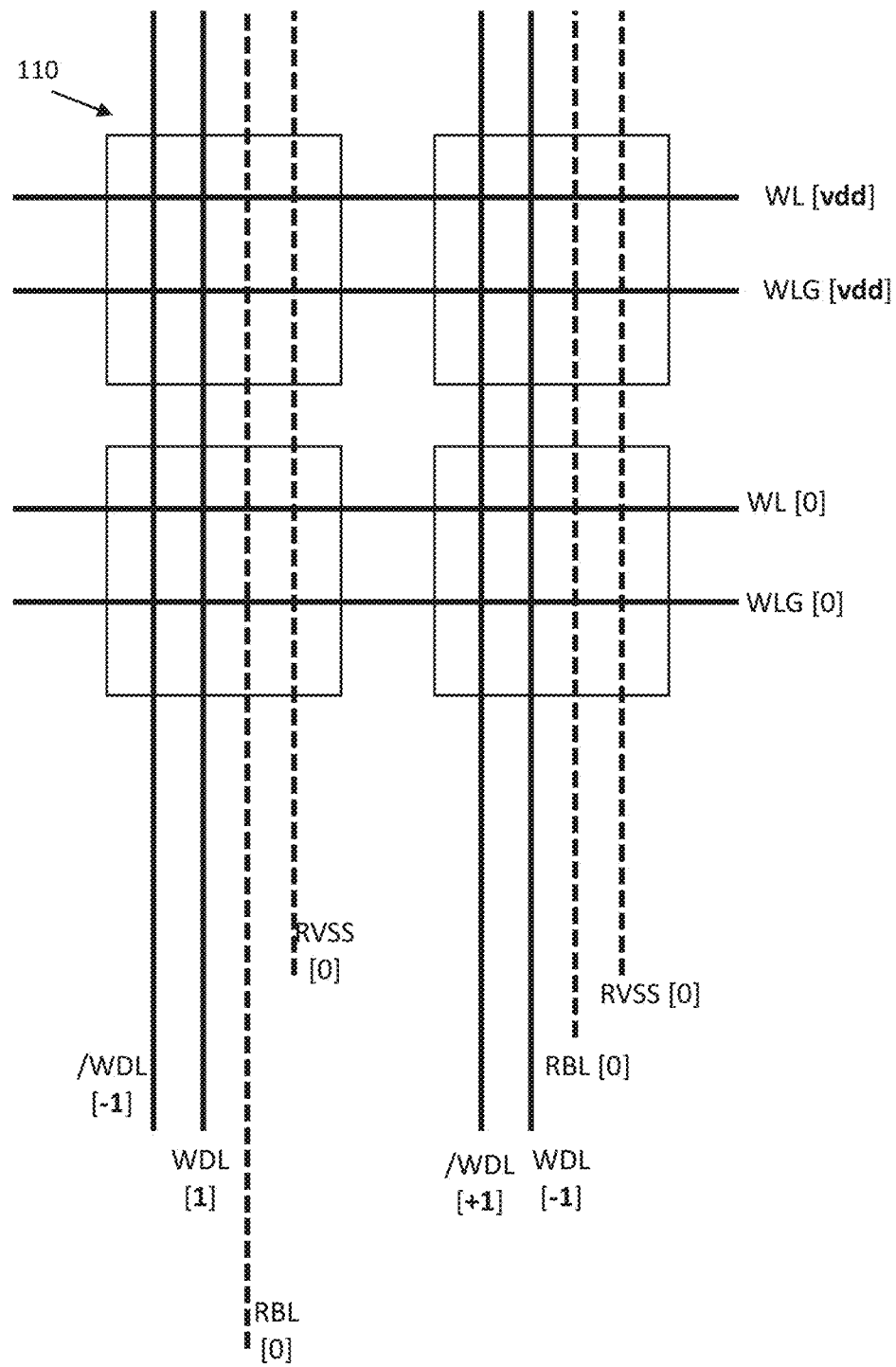
FIG. 16 illustrates a memory array organization for write biasing, according to an embodiment of the present invention.

FIG. 16 shows a write biasing scheme in accordance with embodiments of the present invention. This write biasing scheme may be atypical compared to regular cell configurations because the anchor lines must be parallel to the first word line WL. In a more generic biasing option, the non-selected word lines WL and WLG may be biased at equal distance from the actuation values used for the write digital line WDL and its complement /WDL. Nevertheless, some deviation from this rule can be accommodated if the NEM switch has sufficient hysteresis to keep its state even if it experiences some partial net write voltage. During write, the first word line WL and the second word line WLG should be at substantially equal potential to avoid static current through cell.

During a digital 1 write event, the write digital line WDL is set to the positive + state and the complementary write digital line /WDL is set to the negative − state, e.g. to equal but opposite voltages $V_w$. During a digital 0 write event, the write digital line WDL is set to the negative − state and the complementary write digital line /WDL is set to the positive + state. For the selected data storage cell 110, both the first word line WL and the second word line WLG are set to digital 1. For a digital 1 write event, the top beam, e.g. the beam of the first NEM switch experiences a potential 2V such that it is moved toward the first output node Q, e.g. such that the first word line WL connects to the first output node Q. The bottom beam, e.g. the beam of the second NEM switch experiences a potential 2V in the opposite direction relative to the first NEM switch such that it is moved away from the first output node Q, e.g. such that the second word line WLG disconnects from the first output node Q. Similarly, for a digital write to 0 event, the top beam experiences a potential 2V such that it is moved away from the first output node Q such that the first word line WL disconnects from the first output node Q. The bottom beam experiences a potential 2V in the opposite direction relative to the first NEM switch such that it is moved toward the first output node Q, e.g. such that the second word line WLG connects to the first output node Q.

For the bit line half selected (BLHS) cells, the first word line WL and the second word line WLG are both set to digital 0. The write digital line WDL and the complementary write digital line /WDL are both set to opposite states, as for the active cell. Thus, both the top beam and the bottom beam experience a net force which is substantially zero. In other words, the beams are attracted with equal force to both control gates and hence the forces cancel out, i.e. balance one another. The latter can be understood as follows. Taking a voltage V1 at control gate 1 and V2 at control gate 2, the beam is at (V1+V2)/2, assuming first order formulas. The resulting force on the beam towards control gate 1 is given as $$F=c \cdot \Delta V^2 = c \cdot [V1-(V2+V1)/2]^2 = C \cdot ((V1-V2)/2)^2$$

The resulting force on the beam towards control gate 2 is given as $$F=c \cdot \Delta V^2 = c \cdot [V2-(V2+V1)/2]^2 = C \cdot ((V2-V1)/2)^2$$

As these forces are equal, they indeed cancel one another. Thus the top beam experiences opposing and substantially equal forces towards its two control gates, resulting in a substantially zero net force. The same holds for the bottom beam.

During a write operation, the WLHS cells experience the following bias condition. The first word line WL and the second word line WLG are set to 1V. WDL and /WDL are set to the same voltage, e.g. 0V. Both the top beam and the bottom beam experience a potential 1V-x toward the output node and a potential 1V-x away from the output node, such that again no net force is exerted on either beam.

Figure 17:
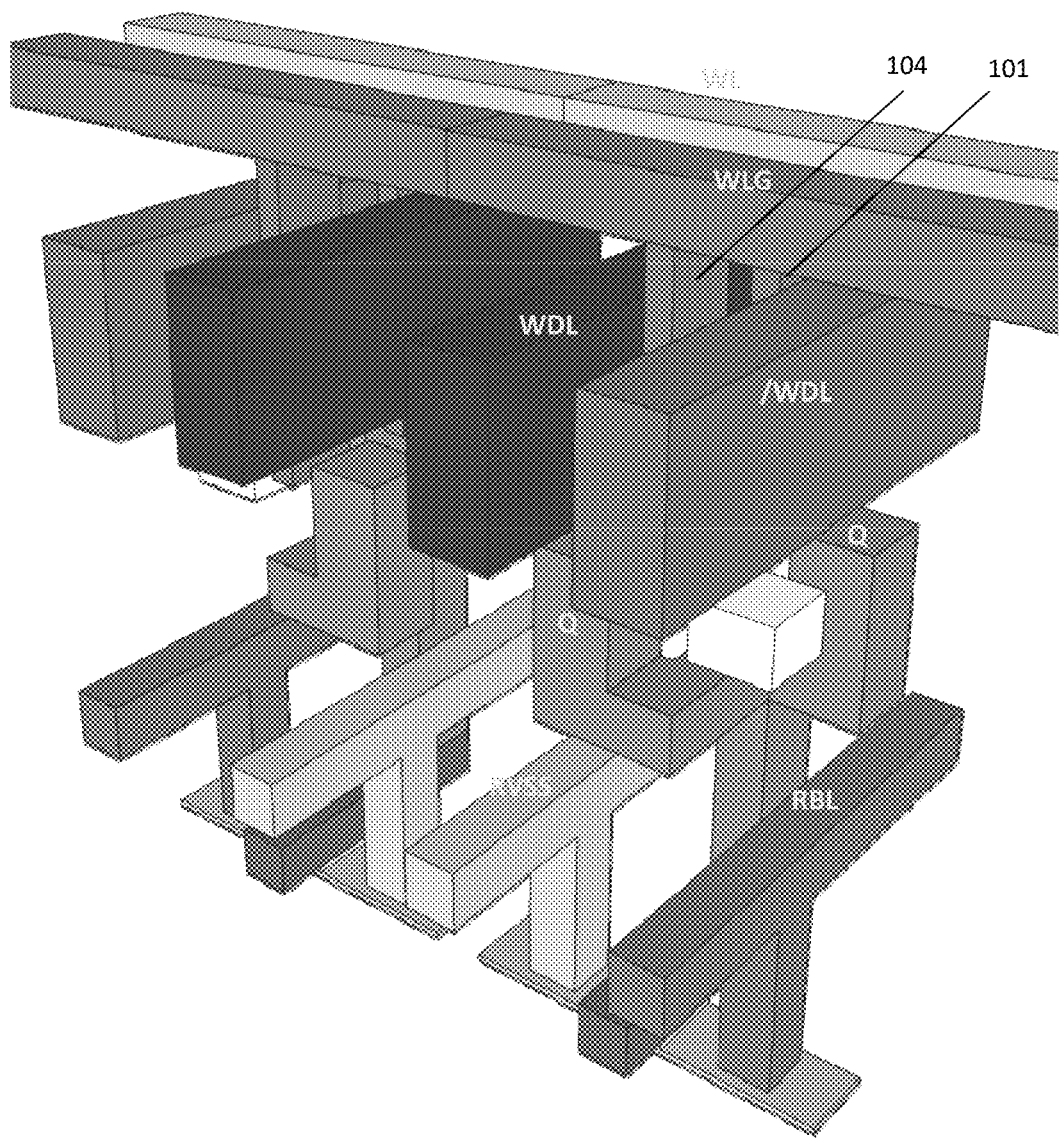
FIG. 17 illustrates a three-dimensional layout for a memory cell, according to an embodiment of the present invention.

FIG. 17 shows an exemplary layout of a memory cell according to embodiments of the present invention. The cells may be provided in a vertical arrangement, e.g. to facilitate implementation of the cells in an array, e.g. a rectangular grid when viewed along a direction parallel to the vertical. For simplicity, only two cells are shown.

Although the cells are shown in mirrored configuration, the cells may also be provided as translated identical copies in a memory layout. The latter may for example have the advantage of reduced crosstalk between the read bit lines RBL of adjacent cells. In a configuration in which the supply RVSS for discharging the read bit line RBL is not shared between multiple bit columns, the RVSS line may also be used as an additional signal line. Furthermore, the read bit line RBL and the supply RVSS may also be twisted to cancel out crosstalk between neighboring lines.

Figure 18:
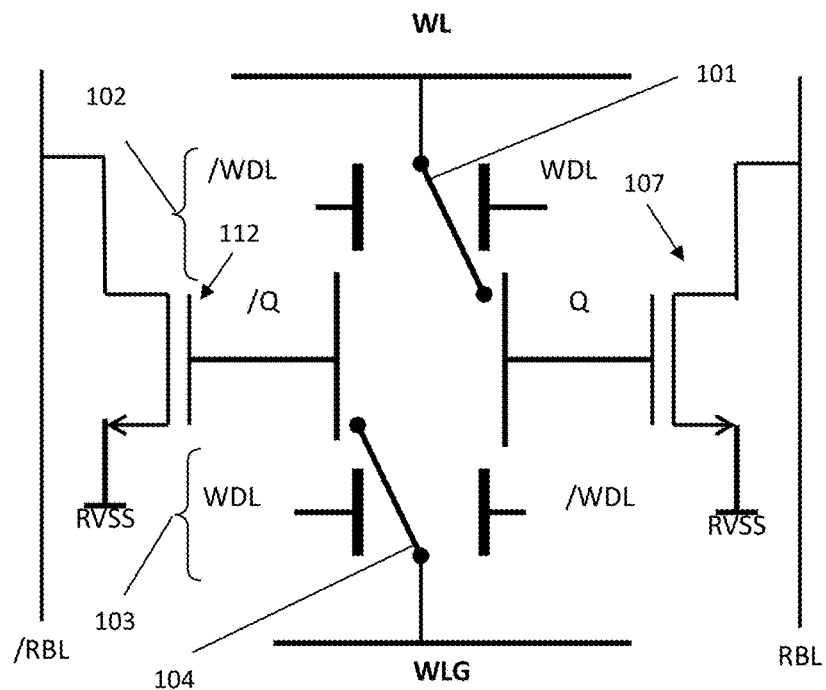
FIG. 18 and FIG. 19 illustrate a memory cell schematic for a cell with two complementary NEM switches with complementary read for a cell state value 0 respectively a cell state value 1, according to an embodiment of the present invention.
Figure 19:
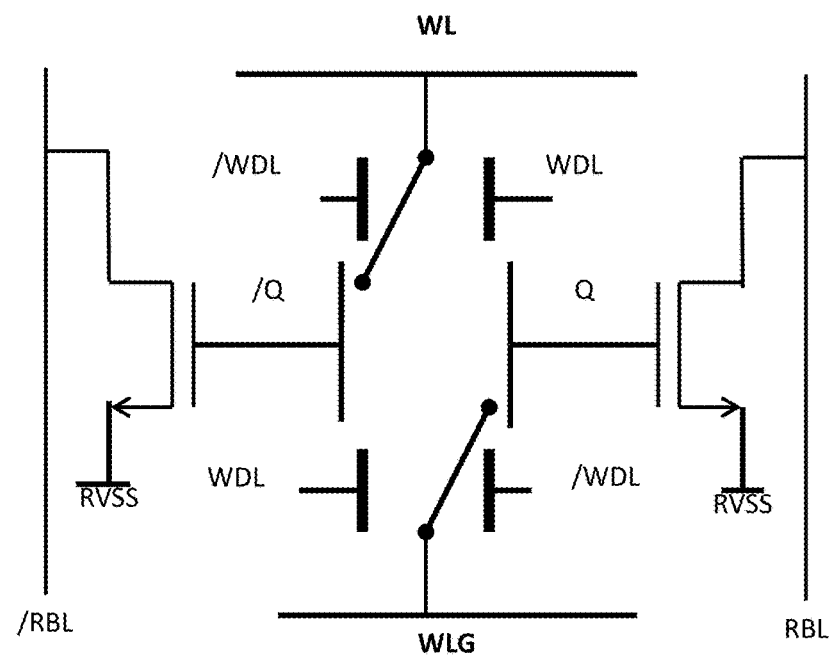

FIG. 18 and FIG. 19 schematically show another example of a device comprising a data storage cell, e.g. an SRAM replacement circuit component, for use in embodiments of the present invention. This circuit comprises a pair of nano electromechanical (NEM) switches and pair of field-effect transistor elements, e.g. a metal-oxide semiconductor field-effect transistor (MOSFET). This third data storage cell corresponds to the first data storage cell described hereinabove, thus comprises a pair of NEM switches which can be actuated to switch the circuit in either one of two states, cell state 0 and cell state 1, respectively illustrated in FIG. 18 and FIG. 19. However, in this cell adapted for complementary readout, the first output node Q is connected to a gate terminal of the first field-effect transistor element 107, e.g. a NMOS element. This transistor 107 connects a read-bitline RBL to a voltage supply line RVSS, whereby in one example RVSS may be 0V, but other voltages also can be selected. However, in this third exemplary memory cell, when not connected to the output node Q, the movable beam 101, 104 is not switched to a floating state, but instead connects to a second output node /Q, and thus provides a complementary output, e.g. an output /Q which is complementary to the first output node Q. the second output node /Q is connected to a gate terminal of the second field-effect transistor element 112, e.g. a NMOS element. This transistor 112 connects a complementary read-bitline /RBL to the voltage supply line RVSS.

Similar to the second data storage cell described hereinabove, the first anchor/source terminal and the second anchor/source terminal may be respectively connected to a first word line WL and a second word line WLG, while a write digit line WDL is connected to respectively the first control gate of the first NEM switch 102 and the second control gate of the second NEM switch 103, and a complementary write digit line /WDL to respectively the second control gate of the first NEM switch 102 and the first control gate of the second NEM switch 103.

A complementary readout as provided by this third data storage cell according to embodiments of the present invention advantageously offers a redundant, complementary copy of the readout signal. Furthermore, the need for a separate reference voltage can be avoided, as the voltage on the read bit line RBL and the complementary read bit line /RBL can be directly compared to determine the output bit state.

Figure 20:
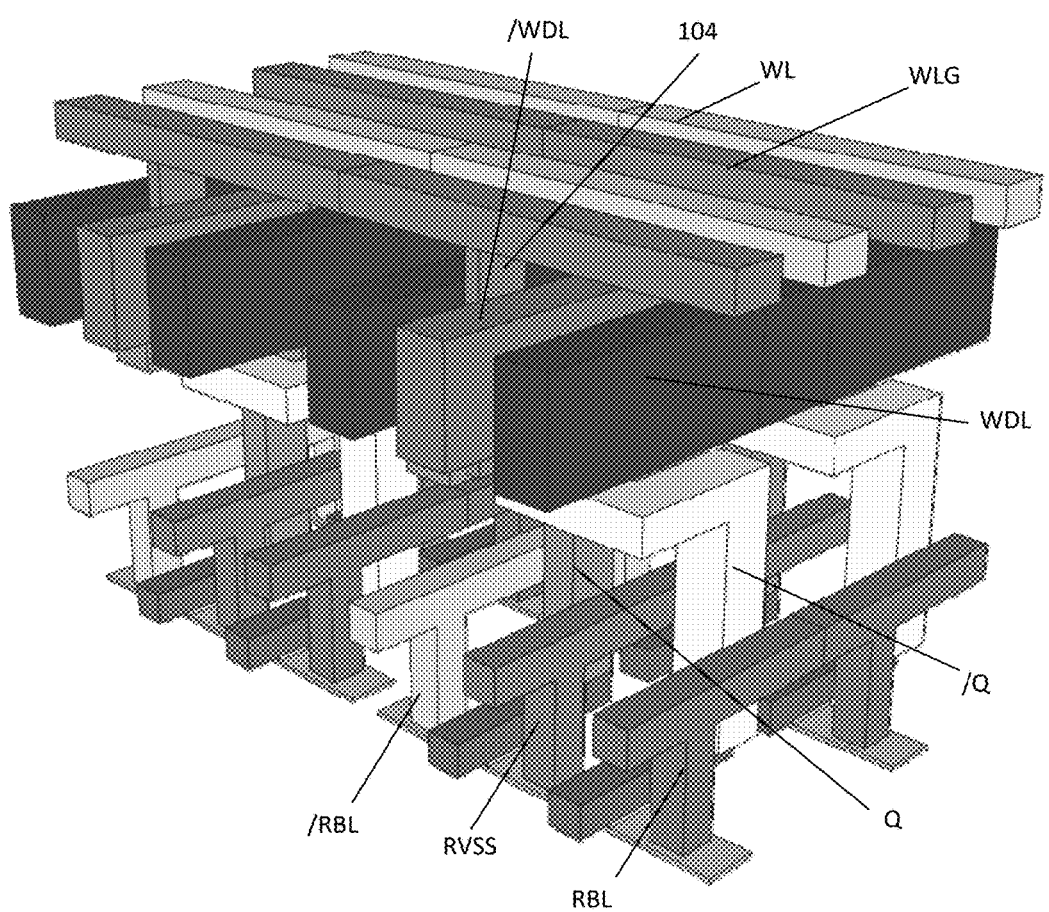
FIG. 20 illustrates a three dimensional layout for a memory cell with complementary read, according to an embodiment of the present invention.

FIG. 20 shows an exemplary layout for a memory array comprising this third memory cell according to embodiments of the present invention. The cells may be provided in a vertical arrangement, e.g. to facilitate implementation of the cells in an array, e.g. a rectangular grid when viewed along a direction parallel to the vertical. For simplicity, only two cells are shown.

What is claimed is:

1. A data storage cell for storing data, the data storage cell comprising:

a first nano electromechanical switch comprising a first moveable beam fixed to a first anchor, a first control gate and a second control gate, a first output node against which the first moveable beam can be positioned, wherein the first output node is physically and electrically isolated from the first control gate and the second control gate;

a second nano electromechanical switch comprising a second moveable beam fixed to a second anchor, a third control gate and a fourth control gate, wherein the second moveable beam can also be positioned against the first output node, wherein the first output node is physically and electrically isolated from the third control gate and the fourth control gate, wherein one or both of the nano electromechanical switches are vertical nano electromechanical switches, wherein the beam is oriented vertically with respect to an average plane through both control gates of the switch, the first nano electromechanical switch and the second nano electromechanical switch being configured for selecting a first or a second state of the data storage cell, the first nano electromechanical switch and the second nano electromechanical switch configured such that the second moveable beam is not positioned against the first output node when the first moveable beam is positioned against the first output node, wherein the first and the second anchors are connected with respective word lines for enabling the movement of the first moveable beam and the second moveable beam, respectively, and wherein the first and second control gate and the third and the fourth control gate are connected with data lines, respectively, for providing data to be stored to the data storage cell; and a first read transistor comprising a single FET, the single FET comprising a transistor gate connected to the first output node, a transistor drain directly connected to a read bit line that is separate from the first output node, and a transistor source directly connected to a DC bias or a second data line, wherein a read current is routed from the read bit line through the single FET to the DC bias or the second data line.

2. The data storage cell according to claim 1, wherein the first read transistor is a MOSFET.

3. The data storage cell according to claim 1, wherein the first and the second anchor are connected to data lines for providing data to be stored to the data storage cell, and wherein the first and second control gate, and the third and the fourth control gate are connected with write word lines, respectively, and configured for enabling the movement of the first moveable beam and the second moveable beam, respectively, according to the data provided to the anchors.

4. A memory arrangement comprising a plurality of data storage cells, wherein one or more of the data storage cells are according to claim 1.

5. The data storage cell according to claim 1, wherein the transistor gate is directly and physically connected to the first output node.

6. A data storage cell for storing data, the data storage cell comprising:

a first nano electromechanical switch comprising a first moveable beam fixed to a first anchor, a first control gate and a second control gate, a first output node against which the first moveable beam can be positioned, wherein the first output node is physically and electrically isolated from the first control gate and the second control gate;

a second nano electromechanical switch comprising a second moveable beam fixed to a second anchor, a third control gate and a fourth control gate, wherein the second moveable beam can also be positioned against the first output node, wherein the first output node is physically and electrically isolated from the third control gate and the fourth control gate, wherein the first and second nano electromechanical switches comprise a common second node or each comprise a separate second node against which their moveable beam can be positioned, wherein the second node is a floating node or is a second output node, the first nano electromechanical switch and the second nano electromechanical switch being configured for selecting a first or a second state of the data storage cell, the first nano electromechanical switch and the second nano electromechanical switch configured such that the second moveable beam is not positioned against the first output node when the first moveable beam is positioned against the first output node, wherein the first and the second anchors are connected with respective word lines for enabling the movement of the first moveable beam and the second moveable beam, respectively, and wherein the first and second control gate and the third and the fourth control gate are connected with data lines, respectively, for providing data to be stored to the data storage cell; and a first read transistor comprising a single FET, the single FET comprising a transistor gate connected to the first output node, a transistor drain directly connected to a read bit line that is separate from the first output node, and a transistor source directly connected to a DC bias or a second data line, wherein a read current is routed from the read bit line through the single FET to the DC bias or the second data line.

7. The data storage cell according to claim 6, wherein the second node is a second output node, and wherein the data storage cell further comprises a second read transistor comprising a transistor gate connected to the second output node thus providing the complementary read from the first read transistor.

8. A memory array comprising:
a read bit line;
a first word line;
a second word line;
a first write data line;
a second write data line; and
a plurality of data storage cells, wherein a first data storage cell of the plurality of data storage cells comprises:
a first nano electromechanical switch comprising a first control gate connected to the second write data line, a second control gate connected to the first write data line, and a first moveable beam fixed to a first anchor and connected to the first word line;
a second nano electromechanical switch comprising a third control gate connected to the first write data line, a fourth control gate connected to the second write data line, and a second moveable beam fixed to a second anchor and connected to the second word line; and
a first read transistor comprising a single FET, the single FET comprising a transistor gate connected to a first output node that is separate from the read bit line, a transistor drain directly connected to the read bit line, and a transistor source directly connected to a DC bias, wherein a read current is routed from the read bit line through the single FET to the DC bias, wherein one or both of the nano electromechanical switches are vertical nano electromechanical switches, wherein the beam is oriented vertically with respect to an average plane through both control gates of the switch, and wherein the first nano electromechanical switch and the second nano electromechanical switch are configured to select a first state or a second state of the first data storage cell, wherein the first moveable beam is positioned against a first output node in the first state and the second moveable beam is not positioned against the first output node in the first state, wherein the second moveable beam is positioned against the first output node in the second state and the first moveable beam is not positioned against the first output node in the first state, wherein the first output node is physically and electrically isolated from the first, second, third, and fourth control gates, and wherein the first and second word lines control selection of the first data storage cell during a read operation of the memory array.

9. The memory array according to claim 8, wherein the transistor gate is directly and physically connected to the first output node.

10. The memory array according to claim 8, wherein a read current during the read operation is routed through a single field-effect transistor.

11. A memory array comprising:
a read bit line;
a first word line;
a second word line;
a first write data line;
a second write data line; and
a plurality of data storage cells, wherein a first data storage cell of the plurality of data storage cells comprises:
a first nano electromechanical switch comprising a first control gate connected to the second write data line, a second control gate connected to the first write data line, and a first moveable beam fixed to a first anchor and connected to the first word line;
a second nano electromechanical switch comprising a third control gate connected to the first write data line, a fourth control gate connected to the second write data line, and a second moveable beam fixed to a second anchor and connected to the second word line; and
a first read transistor comprising a single FET, the single FET comprising a transistor gate connected to a first output node that is separate from the read bit line, a transistor drain directly connected to the read bit line, and a transistor source directly connected to a DC bias, wherein a read current is routed from the read bit line through the single FET to the DC bias, wherein the first nano electromechanical switch and the second nano electromechanical switch are configured to select a first state or a second state of the first data storage cell, wherein the first moveable beam is positioned against a first output node in the first state and the second moveable beam is not positioned against the first output node in the first state, wherein the second moveable beam is positioned against the first output node in the second state and the first moveable beam is not positioned against the first output node in the first state, wherein the first output node is physically and electrically isolated from the first, second, third, and fourth control gates, wherein the first and second word lines control selection of the first data storage cell during a read operation of the memory array, wherein the first and second nano electromechanical switches comprise a common second node or each comprise a separate second node against which their moveable beam can be positioned, and wherein the second node is a floating node or is a second output node.

12. The memory array according to claim 11, wherein the second node is a second output node, and wherein the first data storage cell further comprises a second read transistor comprising a transistor gate connected to the second output node thus providing the complementary read from the first read transistor.

13. A data storage cell for storing data, the data storage cell comprising:
   a first nano electromechanical switch comprising a first moveable beam fixed to a first anchor, a first control gate and a second control gate, a first output node against which the first moveable beam can be positioned, wherein the first output node is physically and electrically isolated from the first control gate and the second control gate;
   a second nano electromechanical switch comprising a second moveable beam fixed to a second anchor, a third control gate and a fourth control gate, wherein the second moveable beam can also be positioned against the first output node, wherein the first output node is physically and electrically isolated from the third control gate and the fourth control gate, the first nano electromechanical switch and the second nano electromechanical switch being configured for selecting a first or a second state of the data storage cell, the first nano electromechanical switch and the second nano electromechanical switch configured such that the second moveable beam is not positioned against the first output node when the first moveable beam is positioned against the first output node, wherein the first and the second anchors are connected with respective word lines for enabling the movement of the first moveable beam and the second moveable beam, respectively, wherein the respective word lines are further configured to control selection of the data storage cell during a read operation, and wherein the first and second control gate and the third and the fourth control gate are connected with data lines, respectively, for providing data to be stored to the data storage cell; and
   a first read transistor comprising a single FET, the single FET comprising a transistor gate connected to the first output node, a transistor drain directly connected to a read bit line that is separate from the first output node, and a transistor source directly connected to a DC bias or a second data line, wherein a read current is routed from the read bit line through the single FET to the DC bias or the second data line.

* * * * *